(12) United States Patent
Bolz

(10) Patent No.: US 7,492,160 B2
(45) Date of Patent: Feb. 17, 2009

(54) DEVICE AND METHOD FOR MEASURING INDIVIDUAL CELL VOLTAGES IN A CELL STACK OF AN ENERGY ACCUMULATOR

(75) Inventor: Stephan Bolz, Pfatter (DE)

(73) Assignee: Siemens Aktiengesellschaft, Munich (DE)

( * ) Notice: Subject to any disclaimer, the term of this patent is extended or adjusted under 35 U.S.C. 154(b) by 476 days.

(21) Appl. No.: 10/575,220

(22) PCT Filed: Sep. 1, 2004

(86) PCT No.: PCT/EP2004/051981

§ 371 (c)(1),
(2), (4) Date: Apr. 10, 2006

(87) PCT Pub. No.: WO2005/036191

PCT Pub. Date: Apr. 21, 2005

(65) Prior Publication Data

US 2007/0290674 A1    Dec. 20, 2007

(30) Foreign Application Priority Data

Oct. 10, 2003  (DE) ............................... 103 47 110

(51) Int. Cl.
*G01N 27/416* (2006.01)
*H02J 7/00* (2006.01)
(52) U.S. Cl. ........................ 324/433; 324/426; 320/116; 320/118
(58) Field of Classification Search ................. 324/426, 324/433, 434; 320/104, 116, 118, 119, 121–123, 320/132, 134
See application file for complete search history.

(56) References Cited

U.S. PATENT DOCUMENTS

| 4,079,303 | A | * | 3/1978 | Cox ........................... 320/119 |
| 5,063,340 | A | * | 11/1991 | Kalenowsky ................ 320/166 |
| 5,545,933 | A | * | 8/1996 | Okamura et al. ............ 307/109 |

FOREIGN PATENT DOCUMENTS

| EP | 0 432 639 A2 | 6/1991 |
| EP | 0 657 745 A1 | 6/1995 |
| JP | 9 236624 | 9/1997 |
| JP | 10 312829 | 11/1998 |

OTHER PUBLICATIONS

"An Op Amp Transfer Circuit to Measure Voltages in Battery Strings", (Wang, et al.), Journal of Power Sources 109, dated Jan. 14, 2002, pp. 253-261.

* cited by examiner

*Primary Examiner*—Akm E Ullah
*Assistant Examiner*—Richard V Muralidar
(74) *Attorney, Agent, or Firm*—Laurence A. Greenberg; Werner H. Stemer; Ralph E. Locher

(57) ABSTRACT

A device and method enable measuring individual cell voltages of cells in a cell stack of an energy accumulator. To this end, a series circuit formed of two diodes is connected in parallel to each cell, the nodes between these diodes are connected to a changeover switch via a respective capacitor and to a differential amplifier via the changeover switch, and an alternating current of a specified frequency and amplitude is fed into these capacitors while generating an alternating voltage corresponding to the cell voltage. This alternating voltage, after rectifying, becomes a direct voltage to ground value for the cell voltage.

9 Claims, 4 Drawing Sheets

FIG. 2
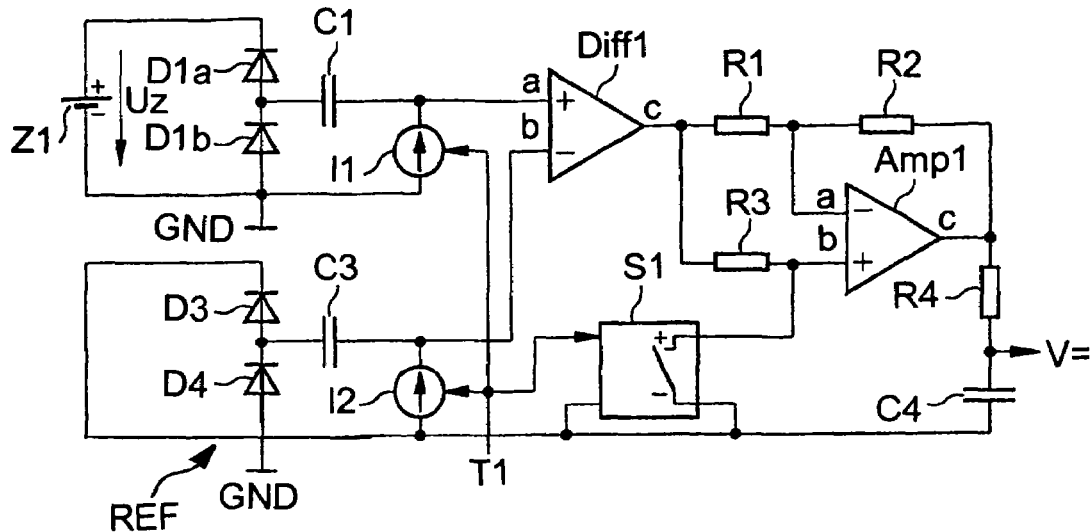
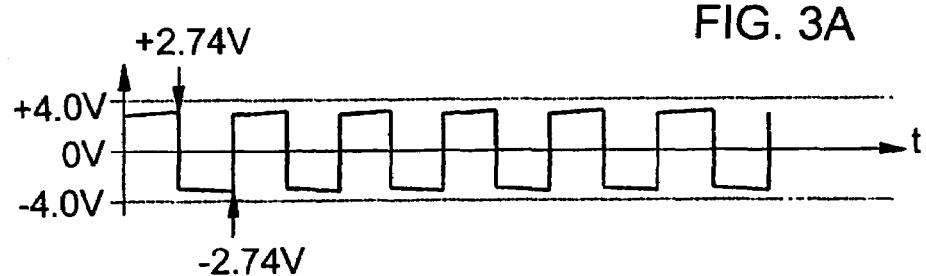
FIG. 3A
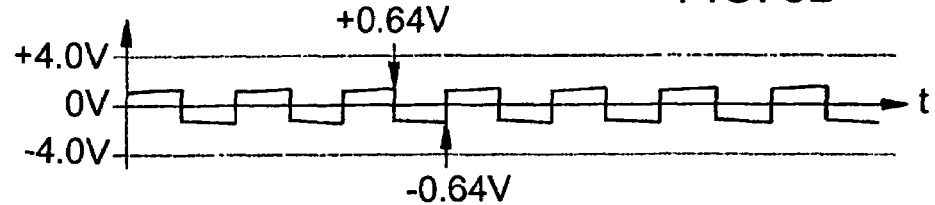
FIG. 3B
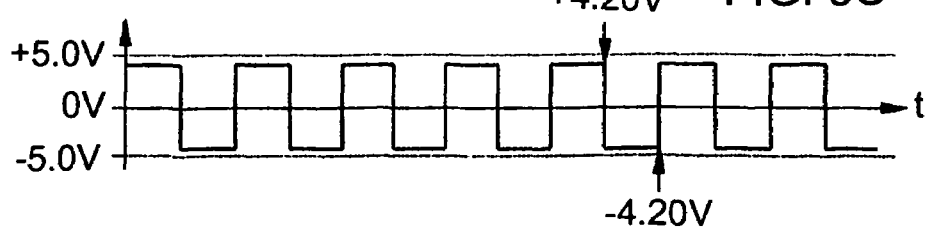
FIG. 3C

DEVICE AND METHOD FOR MEASURING INDIVIDUAL CELL VOLTAGES IN A CELL STACK OF AN ENERGY ACCUMULATOR

BACKGROUND OF THE INVENTION

Field of the Invention

The invention relates to a device for measuring individual cell voltages in a cell stack of an energy accumulator, especially of an energy accumulator in a motor vehicle electrical system.

The invention also relates to a method for operating this device.

In motor vehicle electrical networks, as well as today's usual lead acid accumulators, other energy accumulators also constructed from individual cells will be used, for example nickel-metal-hydride accumulators, Lithium-Ion accumulators and double-layer capacitors.

In lead-acid accumulators the charge provided of the individual cells of the accumulator is balanced out by a slight overcharging of the accumulator as a whole until such time as all cells are finally charged.

Balancing the charge between a weakly-charged accumulator and the group of the remaining accumulators in a plurality of series-connected accumulators by means of a square-wave generator which is connected to these accumulators via a transformer is known from EP 0 432 639 A2.

With the new types of energy accumulator mentioned however the sensitivity of the individual cells to overcharging or overvoltage is a problem. In contrast to lead-acid accumulators, with a lithium-ion accumulator for example the charge voltage of a cell cannot significantly exceed a value of around 4.2V since otherwise the danger of destruction or even of the cell catching fire arises. With double-layer capacitors the maximum charge voltage is about 2.5 to 2.7V.

As a result of production-related differing variation of the self-discharge of the cells, the charge states and cell voltages in a cell stack will assume different values over longer periods of operation.

One problem here is that as a rule only the overall voltage of the cell stack, i.e. of the energy accumulator, can be recorded as the pole voltage, but not the voltage of each individual cell. Thus charge balancing can only be undertaken periodically "on suspicion". If however an increased self-discharge—such as towards the end of the life of the energy accumulator—or an error in a individual cell occurs, for example a short circuit, this cannot be detected immediately. The result of this can be that during the next charge process the charge voltage is divided between fewer cells, so that individual cells are subjected to an increased voltage. This then leads to the destruction of further cells and must be avoided in any event.

It is therefore very desirable to know the voltages of the individual cells in a cell stack of such an energy accumulator in order to be able to react in the appropriate manner.

The measurement of the individual cell voltages is difficult since only the lowest cell has a ground reference point, meaning that it can be recorded with reference to ground (reference potential) whereas for all other cells a conversion to ground potential is necessary in order to be able for example to detect them via the analog/digital converter of a microcontroller.

SUMMARY OF THE INVENTION

The object of the invention is to create a device to measure the voltages of the individual cells of a cell stack in an energy accumulator. Another object of the invention is to specify a method for operating this device.

According to the invention this object is achieved by a device in accordance with the features of claim 1 and a method in accordance with the features of claim 3.

Embodiments according to the invention are explained below in more detail with reference to a schematic drawing.

Advantageous developments of the invention can be taken from the subclaims.

DESCRIPTION OF THE INVENTION

Figure 1:
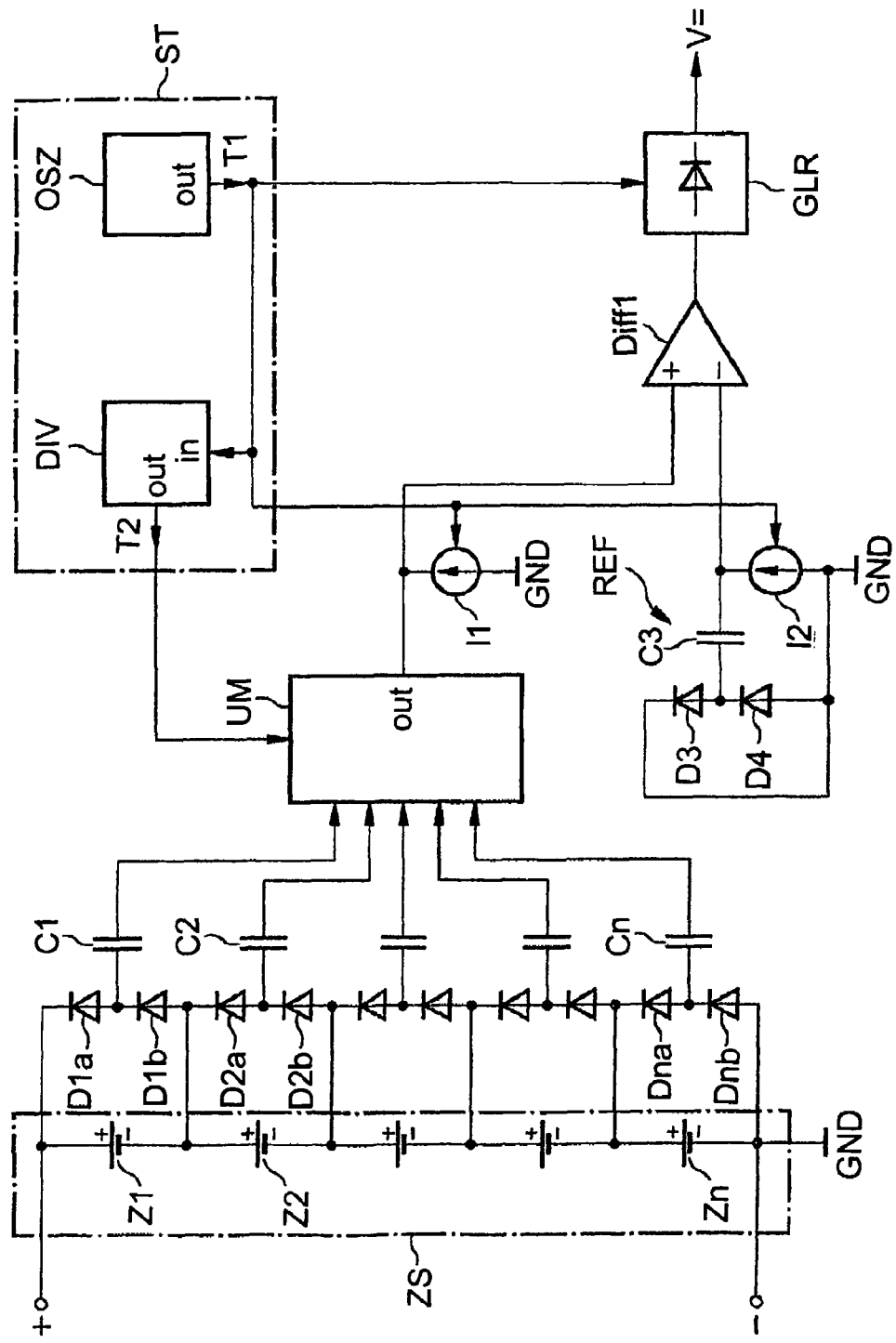
FIG. 1 a basic circuit diagram of a device for measurement of the cell voltages of a cell stack consisting of a number of cells, FIG. 2 a detailed circuit diagram of a first device for measurement of the voltage of an individual cell, FIG. 3 input and output signals of the differential amplifier Diff1 used in the first circuit, FIG. 4 input and output signals of the synchronous rectifier Amp1 used in the first circuit, FIG. 5 a detailed circuit diagram of a second device with an alternative synchronous rectifier Diff2, FIG. 6 input and output signals of the differential amplifier Diff1 used in the second circuit, FIG. 7 input and output signals of the synchronous rectifier Diff2 used in the second circuit 2.

FIG. 1 shows a basic circuit diagram of an inventive device to measure individual cell voltages in a cell stack of an energy accumulator. The Figure shows a cell stack ZS with series-connected cells Z1, Z2 to Zn of a lithium-ion accumulator for example, with the cell connections (plus and minus pole) being brought out. Further details are discussed more closely below.

The invention will be explained initially with reference to a device for voltage measurement at an individual cell in accordance with a detailed circuit diagram shown in FIG. 2.

FIG. 2 shows a device to measure the voltage of an individual cell Z1 of the cell stack ZS shown in FIG. 1, for example of a lithium-ion accumulator with a cell voltage $U_z=4.2V$, of which the minus pole is connected to reference potential GND.

Arranged in parallel to this cell Z1 is a series circuit of two diodes D1$a$ and D1$b$ which conduct current in the direction from the minus pole to the plus pole of the cell Z1.

The connection point of the two diodes D1$a$ and D1$b$ is linked via a capacitor C1 to the non-inverting input of a differential amplifier Diff1.

A reference circuit REF features two series-connected diodes D3 and D4, with the anode of the one diode—D4—being connected to reference potential GND and to the cathode of the other diode—D3.

The connection point of the two diodes D3 and D4 is connected via a capacitor C3 to the inverting input b of the differential amplifier Diff1, of which the output c leads to the input of a rectifier, which in this exemplary embodiment is embodied as a synchronous demodulator (Amp1, R1 to R3 and S1) of which more details will be provided below.

The method in accordance with the invention for operating this device works as follows:

Two alternating current sources I1 and I2 are controlled by an oscillator clock T1 of an oscillator not shown in FIG. 2, of which the first alternating current source I1, arranged between the non-inverting input of the differential amplifier Diff1 or the capacitor C1 and reference potential GND, injects an alternating current into the capacitor C1, while the second alternating current source I2, arranged between the inverting input of the differential amplifier Diff1 or the capacitor C3 and reference potential GND injects an alternating current into the capacitor C3 of the reference circuit REF.

Alternating current source I1 applies a square-wave alternating current of for example ±100 μA to the capacitor C1 The clock frequency in this case is to be selected so that it is high enough for the capacitor not to be significantly charged or discharged during the period of oscillation.

Figure 4A:
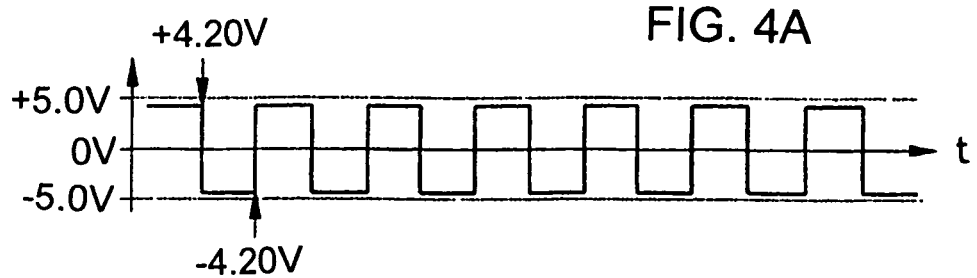
Figure 4B:
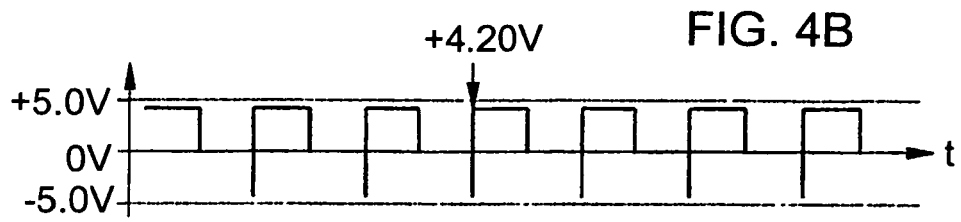
Figure 4C:
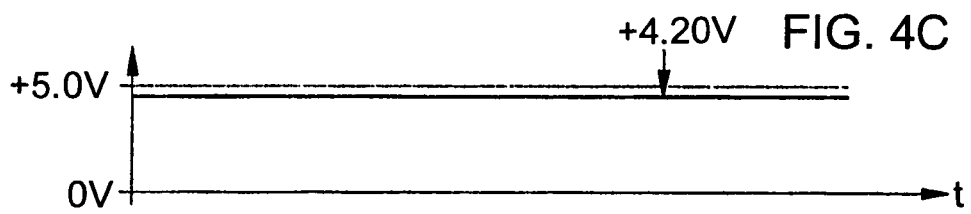

The input and output signals of the differential amplifier Diff1 and of the operational amplifier Amp1 are shown in FIGS. 3 and 4 to which reference will be made during the course of the description.

The signals in FIGS. 3, 4, 6 and 7 are shown in the steady state in each case.

With a positive current the voltage at the two terminals of the capacitor C1 will increase until such time as the diode D1$a$ becomes conductive; with negative current the voltage at the two terminals of the capacitor will decrease until such time as the diode D1$b$ becomes conductive.

This thus produces a square-wave alternating voltage for which the peak-to-peak value in the steady state corresponds to the cell voltage Uz, multiplied by the on-state voltages Ud of the two diodes D1$a$ and D1$b$: V1=Uz+2Ud=4.2V+2*0.64V=5.48V=±2.74V (see FIG. 3$a$).

The alternating current source I2 drives the capacitor C3 with the same capacitance (C3=C1) and current value ±100 μA via the on-state voltages of the two diodes D3 and D4. Since these two diodes are connected to reference potential GND, the alternating voltage here amounts to V2=0V+2*0.64V=1.28V=±0.64V (see FIG. 3$b$). This is the alternating voltage reference.

The difference V1−V2 is now formed in the differential amplifier Diff1: V1−V2=5.48V−1.28V=4.2V. Since the differential amplifier in this exemplary embodiment for example has an amplification factor of "2", an alternating voltage of 8.4V=±4.2V appears at its output c (see FIG. 3$c$).

The output voltage of the differential amplifier Diff1 is now fed to the synchronous demodulator Amp1. The modulator's input signal at the inverting input corresponds to the output signal of the differential amplifier Diff1 (FIG. 4$a$=FIG. 3$c$).

The synchronous demodulator consists of an operational amplifier Amp1, resistors R1 to R4 and a capacitor C4. A switch S1 is arranged between the non-inverting input of the operational amplifier Amp1 and reference potential GND, which is switched over by the oscillator clock T1 (FIG. 4$b$).

When switch S1 is open (positive amplitude of the square-wave signal) the operational amplifier Amp1 has an amplification factor of "+1", when switch S1 is closed (negative amplitude of the square-wave signal), it has a factor of "−1". FIG. 4$b$ indicates how switch S1 periodically connects the non-inverting input of the operational amplifier Amp1 to reference potential and thus switches over the amplification factor.

The output signal V= at the output of the circuit follows the output signal of the operational amplifier Amp1, filtered by a filter formed from the resistor R4 and capacitor C4, in which case any switching problems are eliminated. The output signal V= corresponds to the voltage Uz of the cell Z1 and can be tapped at the output of the synchronous demodulator, related to reference potential GND (or ground potential, 0V).

Figure 5:
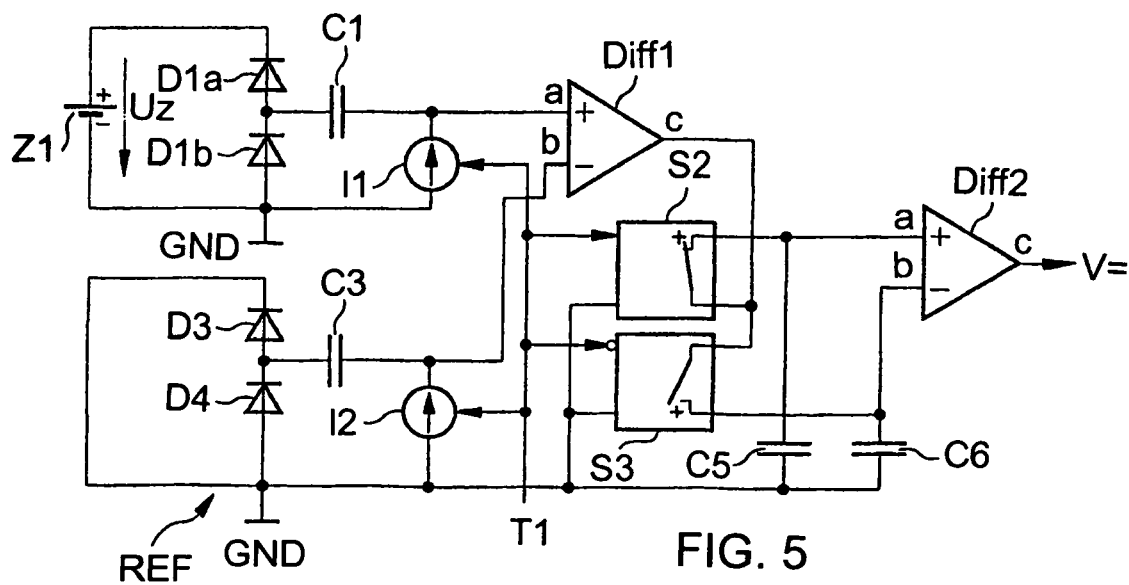

FIG. 5 shows a further detailed switching diagram as shown in FIG. 2 but with an alternate version of the synchronous demodulator consisting of the components Diff2, S2, S3, CS and C6.

The circuit from the cell Z1 via the diodes D1$a$, D1$b$, D3, D4, the capacitors C1 and C3 as well as the alternating current sources I1 and I2 up to the output of c of the differential amplifier Diff1 corresponds to the circuit shown in FIG. 2. The input signals at the inputs a (FIG. 6$a$) and b (FIG. 6$b$) correspond to those shown in FIGS. 3$a$ and 3$b$.

The output signal at output c of the differential amplifier Diff1 is connected by means of two parallel switches S2 and S3 with the oscillator clock T1 alternately to a capacitor C5 as well as the non-inverting input of a further differential amplifier Diff2, or to a capacitor C6 as well as to the inverting input b of the further differential amplifier Diff2

Figure 6A:
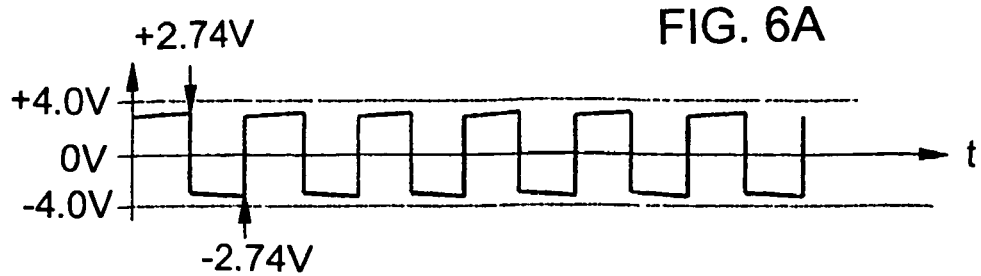
Figure 6B:
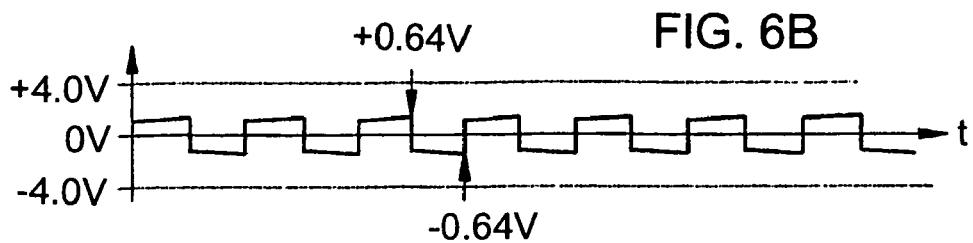
Figure 6C:
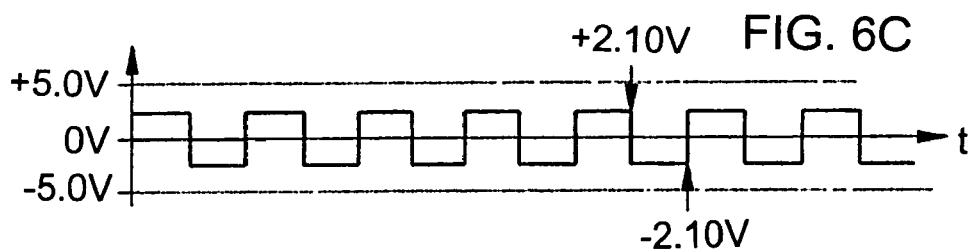
Figure 7A:
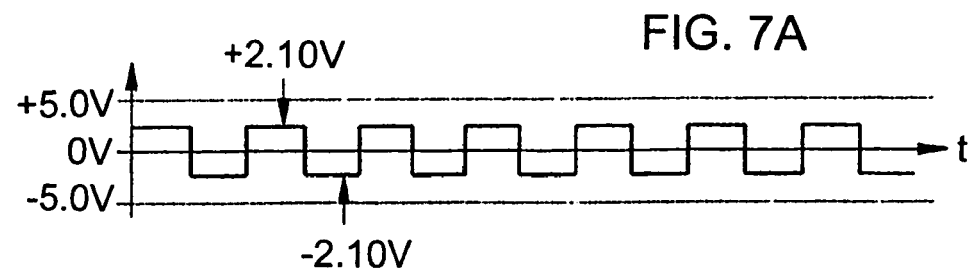
Figure 7B:
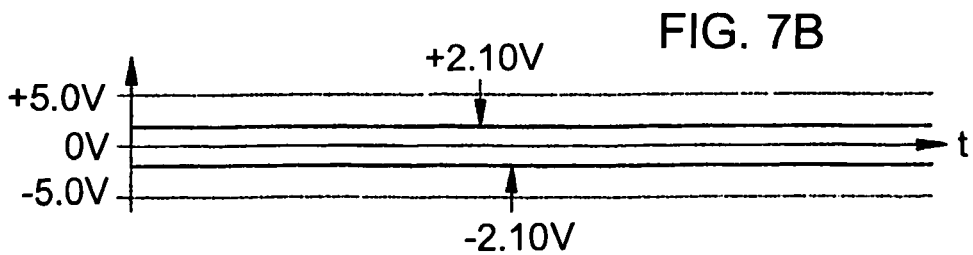
Figure 7C:
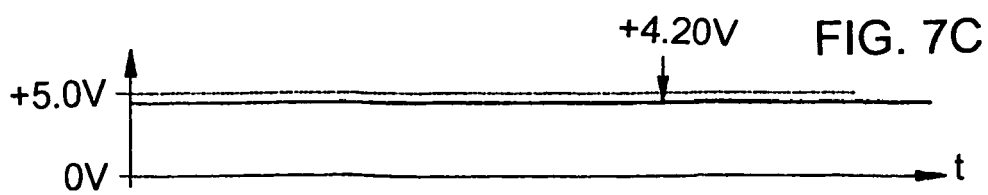

For a positive amplitude of the oscillator clock T1 switch S2 is closed (conductive) and switch 3 opened; For a negative amplitude of the oscillator clock T1 switch S3 s closed and switch 2 is opened. This means that capacitor C5 is charged at the positive value (FIG. 7$b$) and capacitor C6 at the negative value (FIG. 7$b$) of the alternating voltage output signal appearing at the output c of the differential amplifier Diff1 (FIG. 7$a$=FIG. 6$c$).

The further differential amplifier Diff2 now forms the difference between the two direct currents present at its inputs a and b (in the Example: +2.10V and −2.10V=4.20V: FIG. 7$c$), which can be tapped at its output c as grounded direct current V=, which corresponds to the cell voltage Uz.

Whereas FIGS. 2 and 5 each show a detailed circuit diagram for measuring an individual cell voltage to enable the method to be better explained, FIG. 1 shows a basic circuit diagram of an inventive device to measure a plurality of cell voltages in a cell stack of an energy accumulator.

The Figure shows a cell stack ZS with series-connected cells Z1, Z2 to Zn of a lithium-ion accumulator for example. Arranged in parallel to each cell is the series circuit of two diodes D1$a$-D1$b$ to Dna-Dnb which conduct current in the direction from the minus pole to the plus pole of the cell.

The connection points of the two diodes D1$a$-D1$b$ to Dna-Dnb assigned to a cell in each case are routed via a capacitor C1 to Cn to the terminals of a changeover switch UM which connects them in turn, controlled by a divider signal T2 of a clock control ST, to its output.

The clock control ST consists of an oscillator OSZ which creates an oscillator clock signal T1, a square wave alternating voltage of a specific frequency, which is stepped down by means of a frequency divider DIV into a divider signal T2 in order to continue to switch the changeover switch UM after the cell voltage has been successfully detected.

The changeover switch UM must feature a number of switch positions corresponding to the number of cells of the cell stack, which (with the double layer capacitors) can reach an order of magnitude of between 20 and 30. This changeover switch can for example be embodied as a CMOS switch.

The two alternating current sources I1 and I2 known from FIG. 2 are controlled by the oscillator clock T1 of the oscillator OSZ of which the first alternating current source I1 injects an alternating current via the changeover switch UM depending on its switch setting in to one of the capacitors C1 or C2 to Cn, while the second alternating current source I2 injects an alternating current into the capacitor C3 of the reference circuit REF, which as well as this capacitor C3, again features two diodes D3 and D4 of which the connection point is connected to the capacitor C3.

The output of the changeover switch UM and of the terminal of the capacitor C3 not connected to the diodes D3, D4 are connected to the inputs a and b of the differential amplifier Diff1, of which the output c is connected to a rectifier GLR controlled by the oscillator clock T1, at the output of which a direct current V= proportional to the relevant cell voltage Uz appears consecutively.

The rectifier GLR can be embodied as a synchronous demodulator Amp1 or Diff2 shown in FIG. 2 or FIG. 5.

The output signal V= of the rectifier GLR corresponds in the steady state to the voltage Uz of the cell selected in each case with the changeover switch UM, but now shifted in potential with reference to ground GND.

Accordingly with each advance of the changeover switch UM, the corresponding cell voltage is presented at the output of the rectifier GLR. As a result the individual cell voltages are mapped consecutively in relation to ground.

To monitor the cell voltages the voltage sequence can be compared in the simplest case to a lower and an upper value with a limit value comparator. Exceeding the maximum value indicates an overvoltage of the cell here; Dropping below a minimum value indicates a short circuit. This information can now be fed to a monitoring unit which takes appropriate measures in response to it; such as aborting the charging process, initiating a new charge balancing process or sending information to the driver telling them that a visit to the workshop is required.

Supervision using limit value comparators is however very approximate. The cell involved cannot be identified for example. Also with a charge balancing process the point at which charging equilibrium has been achieved cannot be detected.

In a refined supervision using a microcontroller the voltage values V= can be recorded chronologically one after the other with reference to the switching clock of the changeover switch so that a further evaluation of the cell voltage can be undertaken using supervision software.

In charge balancing the slow balancing of the individual cell voltages is detectable so that the ending of the charge or discharge process can be defined.

A long-term supervision of the individual cells is also possible so that—on detection of the fall in the capacity of a cell, an increase of the self-discharge or an increase of the internal resistance of a cell—a warning message can be issued indicating that a trip to the workshop is necessary.

This increases the reliability of the system quite significantly and reduces the repair costs since only the defective cell has to be replaced and no longer the entire cell stack.

The invention claimed is:

1. A device for measuring individual cell voltages of cells in a cell stack of an energy accumulator, comprising:
    a series circuit of two diodes connected in parallel with each cell of the cell stack and connected to conduct current in a direction from a minus pole to a plus pole of the cell;
    a changeover switch having a number of terminals assigned to switch positions corresponding to a number of the cells of the cell stack, and a capacitor connecting each of said terminals to a respective node between said diodes assigned to the cells;
    a reference circuit having first and second diodes connected in series, said first diode having an anode connected to reference potential and to a cathode of said second diode;
    a differential amplifier having a non-inverted input connected to an output of said changeover switch, an inverted input connected via a capacitor to a node between said first and second diodes of said reference circuit, and an output;
    a controlled rectifier having an input connected to said output of said differential amplifier and an output carrying a direct current with a voltage, relative to reference potential, proportional to a cell voltage of the cell respectively selected with said changeover switch;
    a first controlled alternating current source connected between said non-inverting input of said differential amplifier and reference potential;
    a second controlled alternating current source connected between said inverting input of said differential amplifier and reference potential; and
    a clock control having an oscillator outputting an oscillator clock signal and a frequency divider outputting a divider signal, wherein said first and second alternating current sources and said rectifier are controlled by the oscillator clock and said changeover switch is controlled by the divider signal.

2. The device according to claim 1, configured to monitor an energy accumulator in a motor vehicle electrical system.

3. The device according to claim 1, wherein said rectifier is a synchronous demodulator controlled by the oscillator clock.

4. A method of measuring individual cell voltages of cells in a cell stack of an energy accumulator, the method which comprises:
    providing a device according to claim 1;
    for measuring a cell voltage of a given cell of the cell stack, feeding a first square-wave alternating current of a specific frequency and amplitude into the capacitor assigned to the given cell, to thereby produce a first alternating voltage corresponding to the cell voltage of the given cell, multiplied by the on-state voltages of the two diodes connected in parallel with the given cell;
    feeding an alternating current with a frequency and an amplitude corresponding to the first square-wave alternating current into the capacitor assigned to the reference circuit, to thereby produce a second alternating voltage, relative to ground, corresponding to the on-state current of the first and second diodes of the reference circuit;
    forming a difference between the first and second alternating voltages to generate an alternating voltage corresponding to the cell voltage of the given cell; and
    rectifying the alternating voltage corresponding to the cell voltage of the given cell to produce a direct voltage corresponding to the cell voltage of the given cell relative to ground.

5. The method according to claim 4, which comprises performing the method consecutively to all cells of the cell stack.

6. The method according to claim 4, which comprises setting a frequency the alternating currents injected into the capacitors high enough to avoid a significant charge or discharge of said capacitors during the oscillation period.

7. The method according to claim 4, which comprises setting the amplitudes of the alternating currents injected into the capacitors to a value within a µA range.

8. The method according to claim 4, which comprises subjecting the direct current voltage corresponding to the cell current of each cell relative to ground to a limit value comparison at an upper and a lower limit value, and, if the upper limit value is exceeded, deducing an overvoltage of the cell, and if the lower limit value is undershot, deducing a short-circuit of the cell.

9. The method according to claim 4, which comprises storing the direct current voltage values corresponding to the cell voltages of each cell relative to ground, to thereby enable a detection of a slow balancing behavior, during charge balancing, of individual cell voltages and to define a termination of the charging or discharging process and enable long-term monitoring of each individual cell for a drop in the capacitance or an increase in the self-discharge or the internal resistance.

* * * * *